United States Patent
Ham et al.

(10) Patent No.: US 10,553,429 B2
(45) Date of Patent: *Feb. 4, 2020

(54) METHOD OF FORMING PATTERN OF SEMICONDUCTOR DEVICE

(71) Applicant: SAMSUNG ELECTRONICS CO., LTD., Suwon-si, Gyeonggi-do (KR)

(72) Inventors: Boo Hyun Ham, Yongin-si (KR); Hyun Jae Kang, Gunpo-si (KR); Sung Sik Park, Incheon (KR); Yong Kug Bae, Hwaseong-si (KR); Kwang Sub Yoon, Yongin-si (KR); Bum Joon Youn, Suwon-si (KR); Hyun Chang Lee, Gwangmyeong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 338 days.

This patent is subject to a terminal disclaimer.

(21) Appl. No.: 15/355,360

(22) Filed: Nov. 18, 2016

(65) Prior Publication Data

US 2017/0148643 A1    May 25, 2017

(30) Foreign Application Priority Data

Nov. 19, 2015  (KR) .......................... 10-2015-0162658

(51) Int. Cl.
*H01L 21/312* (2006.01)
*H01L 21/033* (2006.01)
*H01L 23/544* (2006.01)

(52) U.S. Cl.
CPC ........ *H01L 21/0337* (2013.01); *H01L 23/544* (2013.01); *H01L 2223/5446* (2013.01); *H01L 2223/54426* (2013.01)

(58) Field of Classification Search
CPC ............. H01L 21/0337; H01L 21/0273; H01L 21/0274; H01L 21/312; H01L 21/31127; H01L 21/31105
USPC .................................................. 430/316, 317
See application file for complete search history.

(56) References Cited

U.S. PATENT DOCUMENTS

| | | | |
|---|---|---|---|
| 7,666,578 B2 | 2/2010 | Fischer et al. | |
| 8,110,340 B2 | 2/2012 | Jung | |
| 8,822,343 B2 | 9/2014 | Hsieh et al. | |
| 8,852,851 B2 | 10/2014 | Zhou et al. | |
| 9,704,721 B2 * | 7/2017 | Lee | H01L 21/0337 |
| 2014/0045336 A1 | 2/2014 | Park | |
| 2016/0155662 A1 * | 6/2016 | Lee | H01L 21/0337 438/668 |

FOREIGN PATENT DOCUMENTS

| | | |
|---|---|---|
| KR | 10-0746618 B1 | 7/2007 |
| KR | 10-2010-0074630 A | 7/2010 |
| KR | 10-2010-0081543 A | 7/2010 |

\* cited by examiner

*Primary Examiner* — Daborah Chacko-Davis
(74) *Attorney, Agent, or Firm* — Lee & Morse, P.C.

(57) ABSTRACT

A method of forming a pattern of a semiconductor device includes forming a mask and a sacrificial layer on a substrate, etching the sacrificial layer in a first area of the substrate to form first units, each having a first width and a first distance from an adjacent unit, etching the sacrificial layer in a second area of the substrate to form second units, each having a second width equal to the first distance and being spaced apart from an adjacent unit by a second distance equal to the first width, forming a spacer conformally covering the first and second units, the spacer having a first thickness and being merged between the second units, removing a portion of the spacer on upper surfaces of the first and second units, and etching the mask in a region from which first and second units have been removed.

20 Claims, 13 Drawing Sheets

METHOD OF FORMING PATTERN OF SEMICONDUCTOR DEVICE

CROSS-REFERENCE TO RELATED APPLICATION

Korean Patent Application No. 10-2015-0162658, filed on Nov. 19, 2015, in the Korean Intellectual Property Office, and entitled: "Method of Forming Pattern of Semiconductor Device," is incorporated by reference herein in its entirety.

BACKGROUND

1. Field

The present disclosure relates to a method of forming a pattern of a semiconductor device.

2. Description of the Related Art

Recently, a semiconductor device has been developed with high-speed operation at low voltage, and a process of manufacturing a semiconductor device has been developed with improved integration degree. Therefore, patterns of a highly-integrated semiconductor device have small widths, and can be spaced apart from each other at fine pitches. Further, with the advance of technology, patterns of a highly-integrated semiconductor device are required to have various widths together.

SUMMARY

Aspects provide a method of forming a pattern of a semiconductor device, by which patterns having various widths can be formed.

Aspects also provide a method of forming a pattern of a semiconductor device, by which patterns having various widths in different areas can be formed.

Aspects also provide a method of forming a pattern of a semiconductor device, by which patterns having uniform width in an area can be formed.

According to an example embodiment, a method of forming a pattern of a semiconductor device includes sequentially forming a mask layer and a sacrificial layer on a substrate that includes a first area and a second area, etching the sacrificial layer in the first area of the substrate to form a plurality of first sacrificial pattern units, each first sacrificial pattern unit having a first width and being spaced apart from an adjacent first sacrificial pattern unit by a first distance, etching the sacrificial layer in the second area of the substrate to form a plurality of second sacrificial pattern units, each second sacrificial pattern unit having a second width equal to the first distance and being spaced apart from an adjacent first sacrificial pattern unit by a second distance equal to the first width, forming a spacer film conformally covering the plurality of first sacrificial pattern units and the plurality of second sacrificial pattern units, the spacer film having a first thickness and being merged between the plurality of second sacrificial pattern units, removing a portion of the spacer film covering upper surfaces of the plurality of first sacrificial pattern units and of the plurality of second sacrificial pattern units to expose the upper surfaces of the plurality of first sacrificial pattern units and the plurality of second sacrificial pattern units, removing the plurality of first and second sacrificial pattern units, and etching the mask layer in a region in which the plurality of first sacrificial pattern units and the plurality of second sacrificial pattern units are removed, so as to form a mask pattern.

According to another example embodiment, a method of forming a pattern of a semiconductor device includes sequentially forming a mask layer, a sacrificial layer, and a photoresist layer on a substrate that includes a first area and a second area, exposing and developing the photoresist layer in the first area of the substrate using a first photo mask to form a plurality of first photoresist pattern units, and exposing and developing the photoresist layer in the second area of the substrate using a second photo mask to form a plurality of second photoresist pattern units, etching the sacrificial layer using the plurality of first photoresist pattern units and the plurality of second photoresist pattern units to respectively form a plurality of first sacrificial pattern units and a plurality of second sacrificial pattern units in the first area and the second area, forming a spacer film conformally covering the plurality of first sacrificial pattern units and the plurality of second sacrificial pattern units, the spacer film having a first thickness and being merged between the plurality of second sacrificial pattern units, removing the spacer film covering upper surfaces of the plurality of first sacrificial pattern units and upper surfaces of the plurality of second sacrificial pattern units to expose the upper surfaces of the plurality of first sacrificial pattern units and the upper surfaces of the plurality of second sacrificial pattern units, removing the plurality of first and second sacrificial pattern units, and etching the mask layer disposed in a region in which the plurality of first sacrificial pattern units and the plurality of second sacrificial pattern units are removed, so as to form a mask pattern, wherein each of the plurality of first photoresist pattern units has a first width and the plurality of first photoresist pattern units are spaced apart from each other by a first distance, and each of the plurality of second photoresist pattern units has a second width and the plurality of second photoresist pattern units are spaced apart from each other by a second distance, and wherein the first width is smaller than the second width, and the first distance is larger than the second distance.

According to yet another example embodiment, a method of forming a pattern of a semiconductor device includes sequentially forming a mask layer and a sacrificial layer on a substrate, etching the sacrificial layer in a first area of the substrate to form a plurality of first sacrificial pattern units, each first sacrificial pattern unit having a first width and being spaced apart from an adjacent first sacrificial pattern unit by a first distance, etching the sacrificial layer in a second area of the substrate to form a plurality of second sacrificial pattern units, each second sacrificial pattern unit having a second width equal to the first distance and being spaced apart from an adjacent second sacrificial pattern unit by a second distance equal to the first width, conformally forming a spacer film on the plurality of first and second sacrificial pattern units, such that the spacer film defines a trench between adjacent first sacrificial pattern units, and fills a space between adjacent second sacrificial pattern units, removing a portion of the spacer film covering upper surfaces of the plurality of first and second sacrificial pattern units, removing the plurality of first and second sacrificial pattern units, and etching the mask layer through a remainder of the spacer film to form a mask pattern.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Hereinafter, preferred embodiments will be described in detail with reference to the attached drawings. In the embodiments, a case where a substrate is a circular wafer will be described by an example. However, embodiments are not limited thereto, and wafers having various shapes, e.g., rectangular shapes, are applicable.

Hereinafter, a method of forming a pattern of a semiconductor device according to some embodiments will be described.

FIGS. 1 to 15 are cross-sectional views of stages in a method of forming a pattern of a semiconductor device according to some embodiments.

Figure 1:
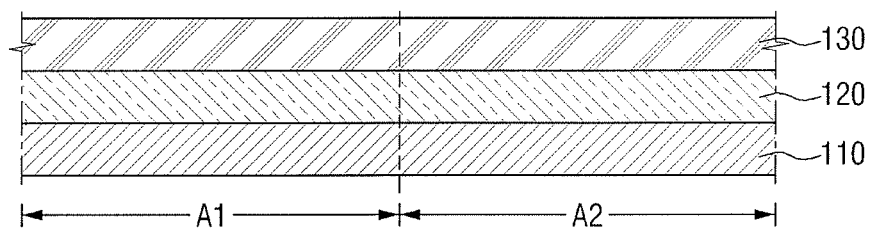
FIGS. 1 to 15 illustrate cross-sectional views of stages in a method of forming a pattern of a semiconductor device according to some embodiments.

Referring to FIG. 1, a mask layer 120 and a sacrificial layer 130 may be sequentially formed on, e.g., directly on, a substrate 110.

The substrate 110 may include a first area A1 and a second area A2. The first area A1 and the second area A2 may be connected with each other or separated from each other. In embodiments, the first area A1 and the second area A2 are areas in which patterns having different widths from each other are formed, but embodiments are not limited thereto.

The substrate 110 may contain a semiconductor material. The substrate 110 may contain at least one of, e.g., Si, Ge, SiGe, GaP, GaAs, SiC, SiGeC, InAs, and InP. A case where the substrate contains a semiconductor material is described hereinafter, but embodiments are not limited thereto. Therefore, the material of the substrate 110 is not limited as long as it is a material capable of forming a pattern through etching.

An etching layer may further be formed on the substrate 110. However, when the substrate 110 is an etching object, i.e., a target layer, the etching layer may not be formed.

In the present embodiment, a case where the substrate 110 is an etching layer, i.e., a target layer, will be described. However, this case is set forth to illustrate embodiments which are not limited thereto.

The mask layer 120 is formed on, e.g., directly on, the substrate 110. The mask layer 120 may be formed of a material having etching selectivity with respect to the substrate 110. That is, the mask layer 120 may be formed of a material that is hardly etched at the time of etching the substrate 110. Therefore, the mask layer 120 may be patterned in a subsequent process to be formed as an etching mask for etching the substrate 110.

The mask layer 120 may be a hard mask layer, and may be any one of a nitride ($Si_3N_4$) film and an oxide ($SiO_2$) film. However, embodiments are not limited thereto. In the drawings, it is shown that the mask layer 120 is a single layer. However, embodiments are not limited thereto, e.g., the mask layer 120 may be formed by laminating two or more layers.

The mask layer 120 may be formed by a plasma-enhanced chemical vapor deposition (PE CVD) process. The mask layer 120 may be formed using a silicon based Spin-On Hard mask (Si—SOH), such as Spin-On Glass (SOG). An antireflection layer may further be formed on the mask layer 120. The antireflection layer may be formed of silicon oxynitride (SiON) through a chemical vapor deposition (CVD) process.

The sacrificial layer 130 may be formed on, e.g., directly on, the mask layer 120. The mask layer 120 and the sacrificial layer 130 may have different etching selectivity from each other. That is, the mask layer 120 may be formed of a material that is hardly etched at the time of patterning the sacrificial layer 130 by etching. Therefore, the mask layer 120 may be patterned in a subsequent process to be formed as an etching mask for etching the substrate 110. However, embodiments are not limited thereto, e.g., the mask layer 120 and the sacrificial layer 130 may have similar etching selectivity, and may be etched together.

The sacrificial layer 130 may be any one of an amorphous carbon film or a metal film, and may also be a silicone-based film containing polysilicon. When the sacrificial layer 130 is an amorphous carbon film, the sacrificial layer 130 may be formed by a spin coating process and a baking process. For example, the sacrificial layer 130 may be formed by forming an organic compound layer on the mask layer 120 using a spin coating process and curing the organic compound layer using a baking process.

Figure 2:
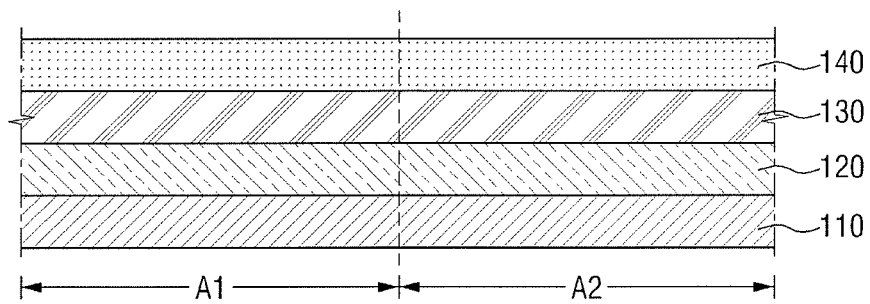

Referring to FIG. 2, a photoresist layer 140 may be formed on, e.g., directly on, the sacrificial layer 130.

The photoresist layer 140 may be formed by chemical vapor deposition (CVD), spin coating, plasma-enhanced chemical vapor deposition (PE-CVD), high density plasma chemical vapor deposition (HDP-CVD), or the like. The thickness of the photoresist layer 140 may be determined in consideration of the size of a pattern to be formed under the photoresist layer 140.

In the case where the photoresist layer 140 is formed by a spin coating process, the photoresist layer 140 can be adjusted to a desired thickness by spraying a photoresist onto the sacrificial layer 130, accelerating a rotation speed to a specific rotation frequency and then performing a high-speed rotation. After the photoresist layer 140 having a desired thickness is formed, residues can be removed by a low-speed rotation.

Before the formation of the photoresist layer 140, the surface of the sacrificial layer 130 may be chemically treated in order to improve the adhesiveness to the photoresist layer 140, i.e., to improve adhesion between the sacrificial layer 130 and the photoresist layer 140. For example, the chemical treatment of the sacrificial layer 130 may include treatment with hexamethyldisilazane (HMDS). In the case where the surface of the sacrificial layer 130 is a hydrophilic surface, the surface thereof is converted into a hydrophobic surface, thereby improving the adhesiveness to the photoresist layer 140. Subsequently, a process of removing an organic solvent contained in the photoresist layer 140 by heating the photoresist layer 140 may be performed.

Subsequently, referring to FIG. 3, first exposure is performed in the first area A1.

In detail, a first photo mask ML1 for forming a pattern is disposed over the photoresist layer 140, and light L is applied to the photoresist layer 140 through the first photo mask ML1. As shown in FIG. 3, the light L passes through only a part of the first photo mask ML1 to be applied to the photoresist layer 140.

The first exposure process may be an extreme ultraviolet (EUV) exposure process for forming a mircopattern. The light L may be applied by using I-line, krypton fluoride (KrF), or argon fluoride (ArF) as a light source, but is not limited thereto. Therefore, in the first exposure process, the light L may be applied by various kinds of light sources in consideration of the width of a pattern to be formed.

In the present embodiment, the first exposure process using the first photo mask ML1 has been described. However, embodiments are not limited thereto, e.g., the first exposure process may be a maskless exposure process not using a photo mask.

Figure 3:
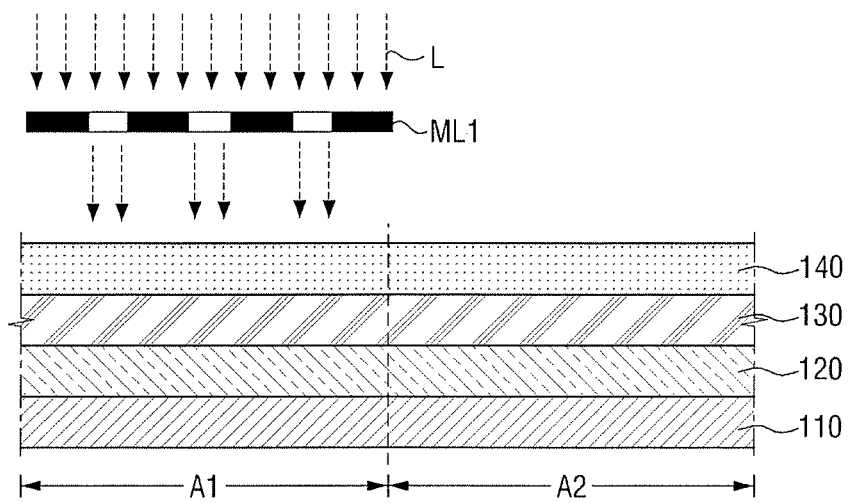

In the present embodiment, it is shown that the upper surface of the photoresist layer 140 disposed in the second area A2 is exposed during the first exposure process (in FIG. 3). However, embodiments are not limited thereto, e.g., a light blocking film may be disposed in the second area A2 during the first exposure process.

Figure 4:
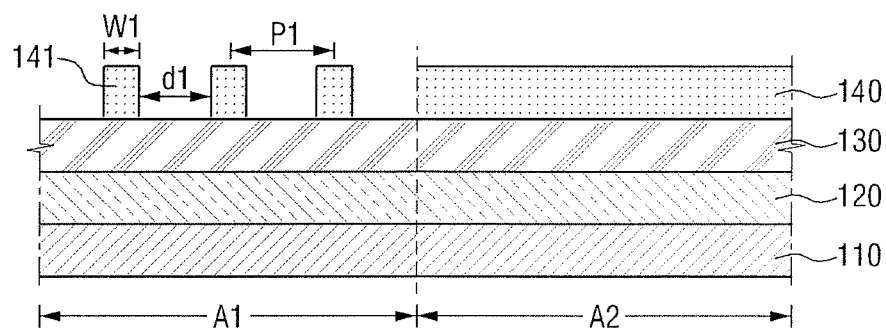

Subsequently, referring to FIG. 4, first development is carried out in the first area A1 to form a first photoresist pattern unit 141.

In detail, a plurality of first photoresist pattern units 141 may be formed on the sacrificial layer 130. A single first photoresist pattern unit 141 may be formed in the shape of a protrusion having a first width W1 in a first direction. One first photoresist pattern unit 141 and another first photoresist pattern unit 141 adjacent thereto in the first direction may be formed to have a first distance d1 therebetween. That is, a concave area, e.g., an opening, may be formed between adjacent first photoresist pattern units 141. Further, the plurality of the first photoresist pattern units 141 may be formed to have a first pitch P1. The first pitch P1 equals a distance between centers of adjacent first photoresist pattern units 141 along the first direction, i.e., a total of the first width W1 with the first distance d1 (FIG. 4).

The first photoresist pattern unit 141 may be a light (L) irradiation area in the aforementioned process of FIG. 3. That is, when the photoresist layer 140 is a positive photoresist layer, the light (L) irradiation area is chemically reacted to be removed by a developer for the first development. However, embodiments are not limited thereto. In contrast, when the photoresist layer 140 is a negative photoresist layer, the area not irradiated with light L is removed by the developer for the first development.

In the present embodiment, a case where the photoresist layer 140 is a positive photoresist layer has been described. However, embodiments are not limited thereto, e.g., the photoresist layer 140 may be a negative photoresist layer.

When the photoresist layer 140 is a positive photoresist layer, the developer may be an aqueous alkali solution, e.g., an aqueous tetramethyl-ammonium-hydroxide (TMAH) solution, but is not limited thereto. The time taken to perform the first development process using the developer may be determined in consideration of the thickness of the photoresist layer 140.

Subsequently, referring to FIG. 5A, a second exposure is carried out in the second area A2.

In detail, a second photo mask ML2 for forming a pattern is disposed over the photoresist layer 140, and then light L is applied to the photoresist layer 140. As shown in FIG. 5A, the light L passes through only a part of the second photo mask ML2 to be applied to the photoresist layer 140.

The second photo mask ML2 for the exposure in the second area A2 may be a phase-inverted photo mask, compared to the first photo mask ML1 for the exposure in the first area A1. That is, the light (L) transmitting area of the second photo mask ML2 may be the light (L) blocking area of the first photo mask ML1, and the light (L) transmitting area of the second photo mask ML2 has the same area as the light (L) blocking area of the first photo mask ML1. Further, the light (L) blocking area of the second photo mask ML2 may be the light (L) transmitting area of the first photo mask ML1, and the light (L) blocking area of the second photo mask ML2 has the same area as the light (L) transmitting area of the first photo mask ML1. Therefore, comparing FIG. 3 and FIG. 5A, the light (L) irradiation area in the second area A2 is relatively larger compared to the light (L) irradiation area in the first area A1.

For example, as described above, the exposure process according to embodiments may also be a maskless exposure process. In this case, it will be understood that the phase-inverted mask is configured such that the light (L) irradiation area in the first area A1 corresponds to the light (L) blocking area in the second area A2, and the light (L) blocking area in the first area A1 corresponds to the light (L) irradiation area in the second area A2.

In the present embodiment, since the first and second photo masks ML1 and ML2, which are phase-inverted to each other, are used in the first and second areas A1 and A2, respectively, the patterns formed in the respective areas may be phase-inverted to each other. More details thereof will be described later.

The second exposure process may be an extreme ultraviolet (EUV) exposure process for forming a mircopattern. The light L may be applied by using I-line, krypton fluoride (KrF), or argon fluoride (ArF) as a light source, but is not limited thereto. Therefore, in the second exposure process, the light L may be applied by various kinds of light sources in consideration of the width of a pattern to be formed.

In the present embodiment, the second exposure process using the second photo mask ML2 has been described. However, embodiments are not limited thereto, e.g., the second exposure process may be a maskless exposure process not using a photo mask.

In the present embodiment, it is shown that the photoresist pattern 141 disposed in the first area A1 is exposed. However, embodiments are not limited thereto, e.g., a light blocking film may be disposed in the first area A1 during the second exposure process.

Figure 5A:
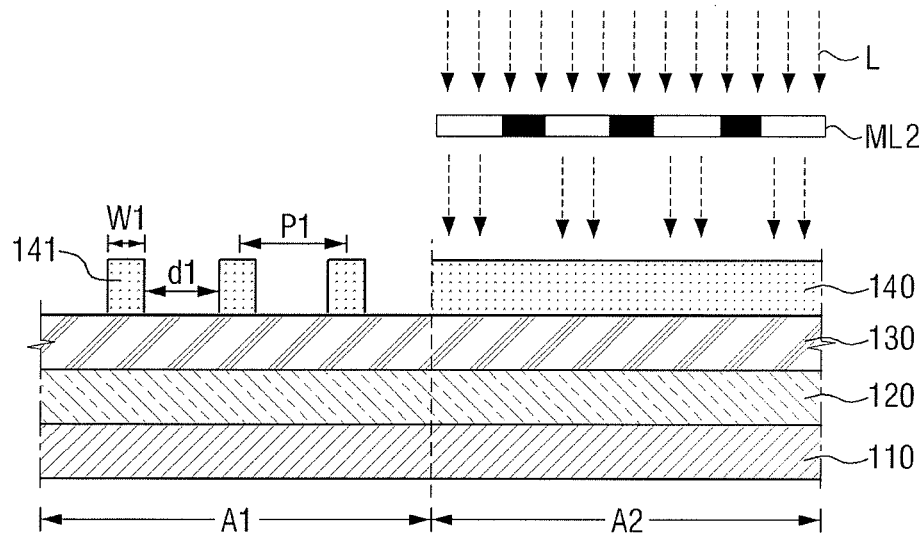
Figure 5B:
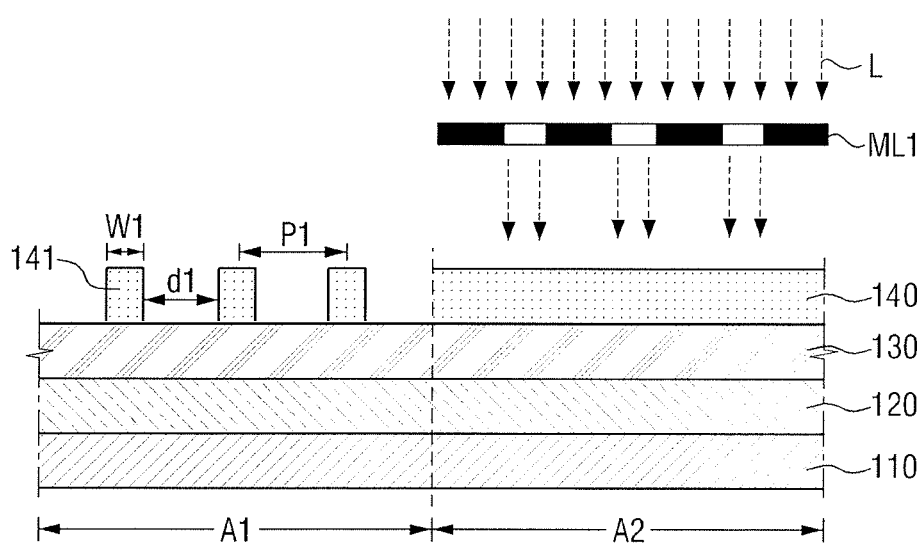

As shown in FIG. 5B, unlike FIG. 5A, the exposure process may be carried out using the first photo mask ML1 which is the same photo mask as that shown in FIG. 3. However, in this case, the first area A1 and the second area A2 may be areas in which different kinds of photoresist layers are formed. That is, when the photoresist layer formed in the first area A1 is a positive photoresist layer, the photoresist layer formed in the second area A2 may be a negative photoresist layer. In contrast, when the photoresist layer formed in the first area A1 is a negative photoresist layer, the photoresist layer formed in the second area A2 may be a positive photoresist layer.

That is, in the case of FIG. 5B, since the kinds of the photoresist layers respectively formed in the first area A1 and the second area A2 are different from each other, the patterns formed in the first area A1 and the second area A2 may be phase-inverted. Therefore, even in the case of FIG. 5B, similarly to FIG. 5A, the pattern shown in FIG. 6 may be formed in the second area A2.

Subsequently, for the convenience of explanation, the remaining stages will be described with reference to FIG. 5A. However, embodiments are not limited thereto.

Figure 6:
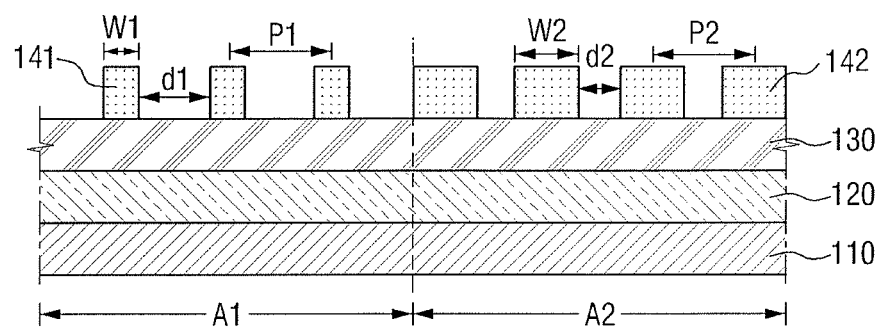

Referring to FIG. 6, a second development is carried out to form a second photoresist pattern unit 142.

The plurality of second photoresist pattern units 142 may be formed on the sacrificial layer 130. The second photoresist pattern unit 142 may be formed in the shape of a protrusion having a second width W2. One second photoresist pattern unit 142 and another second photoresist pattern unit 142 adjacent thereto along the first direction may be formed to have a second distance d2 therebetween. That is, a concave area may be formed between the second photoresist pattern units 142. Further, the plurality of the second photoresist pattern units 142 may be formed to have a second pitch P2.

The second photoresist pattern unit 142 may be a light (L) irradiation area in the aforementioned process of FIG. 5A. That is, when the photoresist layer 140 is a positive photoresist layer, the light (L) irradiation area is chemically reacted to be removed by a developer for the second development.

In the present embodiment, since the plurality of second photoresist pattern unit 142 are formed in the second area A2 by using the second photo mask ML2 that is phase-inverted with respect to the first photo mask ML1, they may have phase-inverted shapes compared to the plurality of first resist pattern unit 141 formed in the first area A1. That is, the size of the second width W2 of the second photoresist pattern unit 142 may be equal to the size of the first distance d1 of the first photoresist pattern unit 141, and the size of the second distance d2 of the second photoresist pattern unit 142 may be equal to the size of the first width W1 of the first photoresist pattern unit 141. Therefore, the second photoresist pattern unit 142 formed in the second area A2 may have a large width, and the first photoresist pattern unit 141 formed in the first area A1 may have a large spaced distance.

According to embodiments, the second photoresist pattern unit 142 may be disposed such that the edge and side wall of the second area A2 are connected with each other, e.g., lateral sidewalls of the second area A2 and an outermost second photoresist pattern unit 142 may be level with each other at each edge of the second area A2 (at both right and left edges of area A2 in FIG. 6). That is, the second photoresist pattern unit 142 may be disposed at the edge of the second area A2 such that the upper surface of the sacrificial layer 130 is not exposed at the edge thereof. However, embodiments are not limited thereto.

Figure 7:
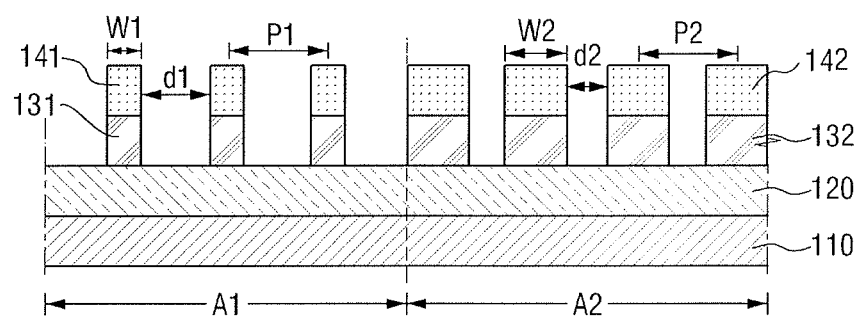

Referring to FIG. 7, the sacrificial layer 130 is etched using the first and second photoresist pattern units 141 and 142.

Specifically, in the first area A1, the sacrificial layer 130 is etched using the plurality of first photoresist pattern units 141 having the first width W1 and spaced apart from each other by the first distance d1, so as to form a first sacrificial pattern 131. Further, in the second area A2, the sacrificial layer 130 is etched using the plurality of second photoresist pattern units 142 having the second width W2 and spaced apart from each other by the second distance d2, so as to form a second sacrificial pattern 132.

Figure 8:
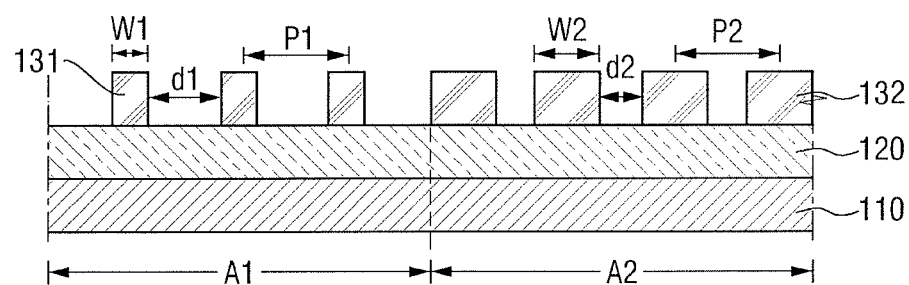

Referring to FIG. 8, the first and second photoresist pattern units 141 and 142 are removed.

The first and second photoresist pattern units 141 and 142 may be removed together by the etching process of FIG. 7. Since the first and second sacrificial patters 131 and 132 are respectively formed using the first and second photoresist pattern units 141 and 142, the first and second sacrificial patters 131 and 132 may be formed to have the same widths and distances as the first and second photoresist pattern units 141 and 142, respectively.

That is, as shown in FIG. 8, the plurality of first sacrificial patterns 131 may have the first width W1 and may be spaced apart from each other by the first distance d1. Further, the plurality of second sacrificial patterns 132 may have the second width W2 and may be spaced apart from each other by the second distance d2.

Figure 9:
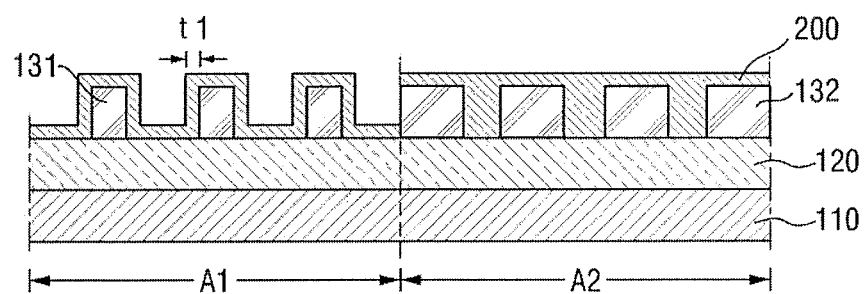

Referring to FIG. 9, a spacer film 200 covering the first area A1 and the second area A2 is formed.

In detail, the spacer film 200 covering the first and second sacrificial patterns 131 and 132 in the first and second areas A1 and A2 is formed. The spacer film 200 may be conformally formed along the upper surface and side wall of the first and second sacrificial patterns 131 and 132. The spacer film 200 may be formed to have a first thickness t1, e.g., the spacer film 200 may have a same uniform thickness in both first and second areas A1 and A2.

For example, in the first area A1, the spacer film 200 may partially fill the first sacrificial pattern 131 to form a trench, e.g., the spacer film 200 may be conformal on the first sacrificial pattern 131 and the mask layer 120 to define a trench between two adjacent first sacrificial patterns 131. For example, in the second area A2, the spacer film 200 may fully fill the second sacrificial pattern 132, e.g., the spacer film 200 may completely fill a space between two adjacent first sacrificial patterns 131 and cover top surfaces thereof.

In detail, comparing the first thickness t1 of the spacer film 200 with the numerical value of each of the first and second sacrificial patterns 131 and 132 shown in FIG. 8, the size of the first distance d1 may exceed two times the size of the first thickness t1. Therefore, the spacer films 200 formed in the first area A1 are not merged with each other between the first sacrificial layers 131, e.g., the spacer film 200 may not fill an entire space between two adjacent first sacrificial patterns 131. Further, the size of the second distance d2 may be two times or less the size of the first thickness t1. Therefore, as shown in FIG. 9, the spacer film 200 disposed between the second sacrificial patterns 132 is merged to fully fill the space between the second sacrificial patterns 132. In other words, as the first and second distances d1 and d2 are different from each other, the spacer film 200 with the uniform thickness may be formed conformally in both first and second areas A1 and A2 to fill the first and second distances d1 and d2 to different degrees.

Figure 10:
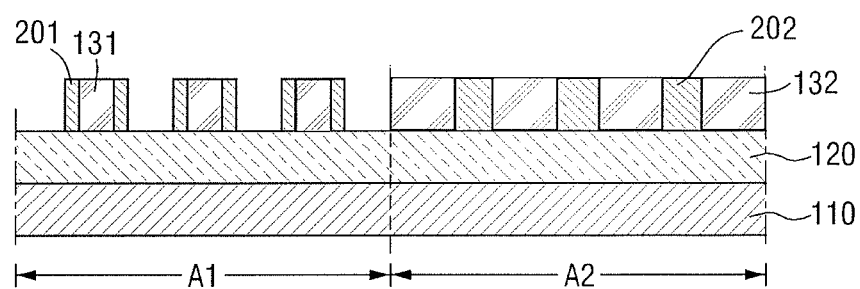

In the present embodiment, the spacer film 200 disposed in the second area A2 may be formed on the upper surface of the second sacrificial pattern 132 and between adjacent second sacrificial patterns 132. Therefore, in the case of the second sacrificial pattern 132 having a lateral surface that is not provided in the adjacent another sacrificial pattern 132, e.g., when the second sacrificial pattern 132 has a lateral surface not facing an adjacent sacrificial pattern 132, the spacer film 200 disposed on that lateral surface may be removed. That is, as shown in FIG. 10, one side of the second sacrificial pattern 132 disposed at the edge of the substrate 110 may be exposed without being coated with the spacer film 200.

The spacer film 200 may be formed of a material having etching selectivity with respect to the first and second sacrificial patterns 131 and 132. The spacer film 200 may contain silicon oxide, e.g., intermediate-temperature oxide (MTO), high-temperature oxide (HTO), or ALD oxide. However, embodiments are not limited thereto.

Subsequently, referring to FIG. 10, a part of the spacer film 200 is removed. In detail, a part of the spacer film 200 may be removed by an etch-back process. That is, a part of the spacer film 200 is removed by an etch-back process to form a first spacer 201 and a second spacer 202. The first spacer 201 may be disposed in the first area A1, and the second spacer 202 may be disposed in the second area A2.

Figure 11:
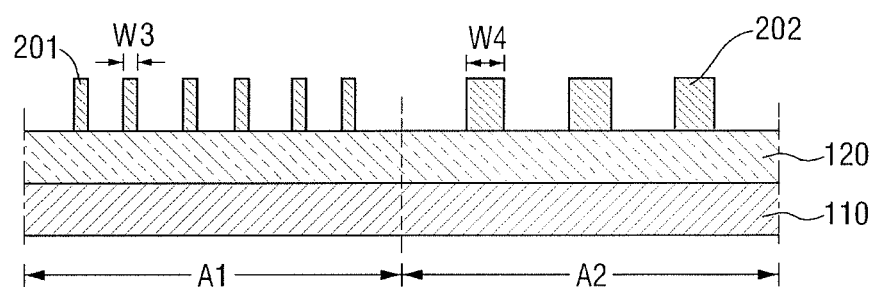

Subsequently, referring to FIG. 11, the first and second sacrificial patterns 131 and 132 are removed. The first and second spacer 201 and 202 may be formed of a material having etching selectivity with respect to the first and second sacrificial patterns 131 and 132. Therefore, the first and second sacrificial patterns 131 and 132 may be removed using an etchant that does not etch the first and second spacer 201 and 202 while etching the first and second sacrificial patterns 131 and 132. In the present embodiment, the side walls of the first and second spacers 201 and 202 may be exposed through the process of removing the first and second sacrificial patterns 131 and 132.

Since the first spacer 201 is formed by the non-merged spacer film 200 and the second spacer 202 is formed by the merged spacer film 200, the size of the width W4 of the second spacer 202 may be two times the size of the width W3 of the first spacer 201. However, the widths of the first and second spacers 201 and 202 are not limited thereto, and may be variously formed according to the widths and distances of the first and second sacrificial patterns 131 and 132.

In embodiments, patterns having different widths from each other can be formed using one spacer film having uniform thickness. Further, all the spacers disposed in the respective areas can be formed to have uniform widths by removing the spacer film disposed at the edge or by not forming the spacer film. For example, referring to FIG. 11 again, all the spacers disposed within a respective area have uniform widths, e.g., all the spacers within the first area A1 have the same width W3.

Figure 12:
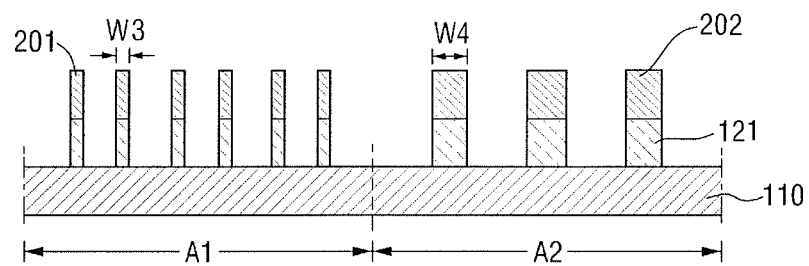
Figure 13:
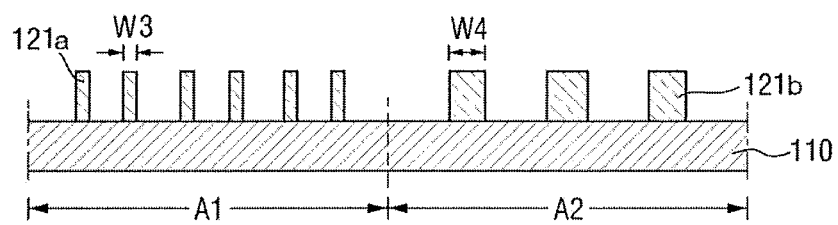

Subsequently, referring to FIGS. 12 and 13, a mask pattern is formed using the first and second spacers 201 and 202.

That is, in the first area A1, the mask layer 120 is etched using the first spacer 201. Similarly, in the second area A2, the mask layer 120 is etched using the second spacer 201. Thus, in the first area A1, a first mask pattern 121a having a third width W3 is formed, and, in the second area A2, a second mask pattern 121b having a fourth width W4 is formed.

Figure 14:
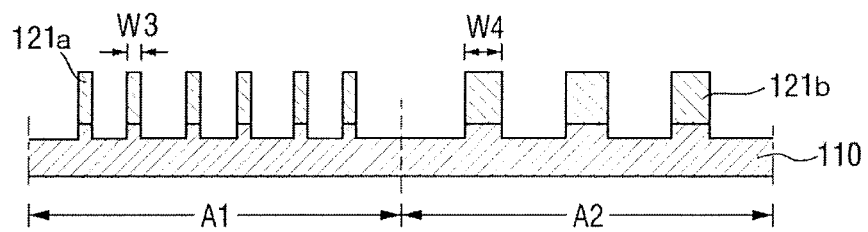
Figure 15:
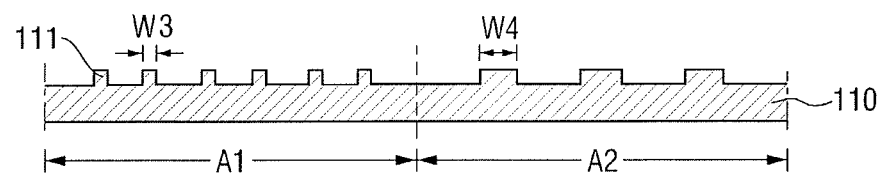

Subsequently, referring to FIGS. 14 and 15, a plurality of fins are formed by etching the substrate 110.

In the first area A1, a fin 111 having a third width W3 is formed by etching the substrate 110 using the first mask pattern 121a having a third width W3, and, in the second area A2, a fin 111 having a fourth width W4 is formed by etching the substrate 110 using the second mask pattern 122a having a fourth width W4.

In embodiments, the fins 11 respectively formed in the first and second areas A1 and A2 have different widths from each other. Further, each of the fins 11 formed in the first and second areas A1 and A2 have uniform widths. Therefore, through the method of forming a pattern of a semiconductor device according to the present embodiment, patterns having various widths in different areas from each other and having uniform width in each area can be formed.

In the drawings, although it is shown that one first area A1 and one second area A2 are formed on the substrate 110, a plurality of first areas A1 and a plurality of second areas A2 may be formed on the substrate 110. The plurality of first and second areas A1 and A2 may be alternately formed, and, if necessary, the plurality of first and second areas A1 and A2 may be freely arranged. It is obvious that the above arrangements can also be applied to the method of forming a pattern of a semiconductor device according to some embodiments.

Figure 16:
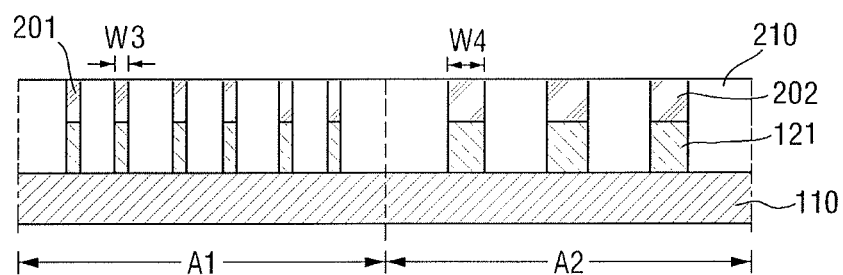
FIGS. 16 to 18 illustrate cross-sectional views of stages in a method of forming a pattern of a semiconductor device according to some embodiments.
Figure 17:
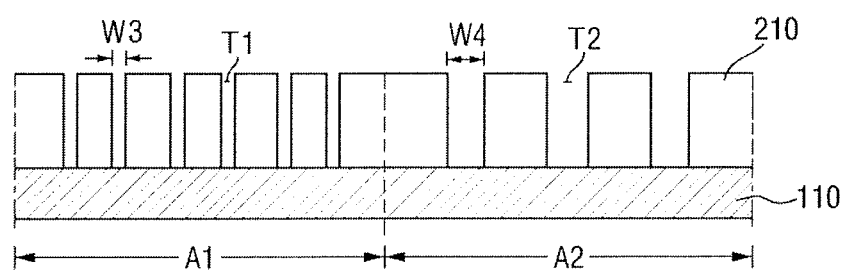
Figure 18:
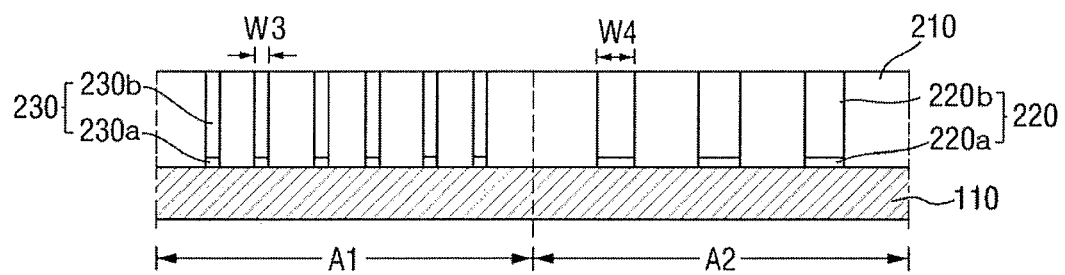

FIGS. 16 to 18 are cross-sectional views for explaining a method of forming a pattern of a semiconductor device according to some embodiments.

In the method of forming a pattern of a semiconductor device according to the present embodiment, steps after the step shown in FIG. 12 will be described, compared to the method of forming a pattern of a semiconductor device having been described with reference to FIGS. 1 to 15. Therefore, repeated description of the same configuration will be omitted.

Referring to FIG. 16, an interlayer insulating film 210 covering the first and second spacers 201 and 202 and the mask pattern 121 is formed. The interlayer insulating film 210 may be formed of silicone oxide, e.g., BSG (borosilicate glass), PSG (phosphosilicate glass), BPSG (borophosphosilicate glass), USG (undoped silicate glass), or TEOS (tetraethylorthosilicate glass), through HDP-CVD (High Density Plasma-CVD). However, embodiments are not limited thereto.

Subsequently, referring to FIG. 17, the first and second spacers 201 and 202 and the mask pattern 121 are removed to form first and second trenches T1 and T2.

The first trench T1 may have a third width W3, and the second trench T2 may have a fourth width W4 larger than the third width W3.

Subsequently, referring to FIG. 18, a first gate 230 is formed in the first trench T1 of the first areas A1, and a second gate 220 is formed in the second trench T2 of the second area A2.

The first gate 230 may include a first gate insulating film 230a and a first gate metal 230b, and the second gate 220 may include a second gate insulating film 220a and a second gate metal 220b. Each of the first and second metal 230b and 220b may include a plurality of metal layers.

Subsequently, the method of forming a pattern of a semiconductor device according to some embodiments will be described with reference to FIGS. 19 and 20.

Figure 19:
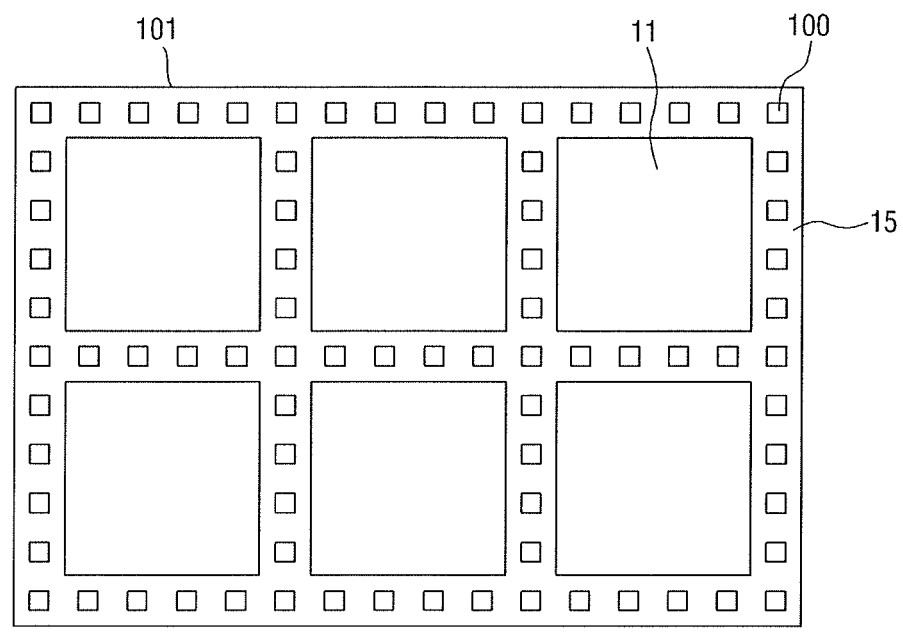
FIG. 19 illustrates a layout diagram of a substrate used in a method of forming a pattern of a semiconductor device according to some embodiments.

FIG. 19 is a layout diagram of a substrate used in the method of forming a pattern of a semiconductor device according to some embodiments. FIG. 20 is a layout diagram of an overlay pattern to which the method of forming a pattern of a semiconductor device according to some embodiments.

Referring to FIG. 19, a substrate 101 may include a first area 11 and a second area 15. A plurality of transistors may be formed in the first area 11. That is, the first area 11 is an area in which a semiconductor chip is formed. The second area 15 may include a scribe lane. The scribe lane may be provided with an alignment key and an overlay pattern 100. The first area 11 may correspond to the first area A1 that has been described with reference to FIGS. 1 to 18, and the second area 15 may correspond to the second area A2 that has been described with reference to FIGS. 1 to 18.

The scribe lane may surround an area in which semiconductor chips are formed. The scribe lane may be disposed between semiconductor chips in a cross form, and a plurality of semiconductor chips may be disposed in a grid form. That is, the first areas 11 may be disposed in a grid form, and the second area 15 may include a rectangular area surrounding the outermost frame of the first areas 11 and cross-shaped areas disposed between the first areas 11.

In the process of manufacturing a semiconductor, a plurality of masks or reticles can be used to form a desired pattern on the substrate 101. In this case, an alignment key and an overlay mark are necessarily used.

The term "alignment" means that the position of each mask or reticle is adjusted according to predetermined criteria, i.e., an alignment key, when a plurality of masks or reticles are sequentially applied to a wafer. The concept of such arrangement is reflected when forming reticles as well as when manufacturing a wafer. In contrast, the term "overlay" means that patterns are formed by exposure, it is determined whether the patterns are appropriately disposed, and, when the difference between the pattern and a desired pattern exists, the measured overlay value is fed back, so as to adjust the positions of the patterns to be manufactured thereafter. Since overlay observing meters detect the light reflected from the overlay pattern, they may be provided in the scribe lane not to overlap each other in consideration of the interference of light.

In some embodiments, as described above, a pattern having a relative large width may be formed in the second area 15, and a pattern having a relatively small width may be formed in the first area 11. That is, in the first area 11 in which a semiconductor chip is formed, a pattern having a relatively small width may be formed in consideration of the formation of microelements, and, in the second area 15 in which an overlay pattern is formed, a pattern having a relative large width may be formed in order to perform easy overlay measurement and adjust the position of a pattern.

Figure 20:
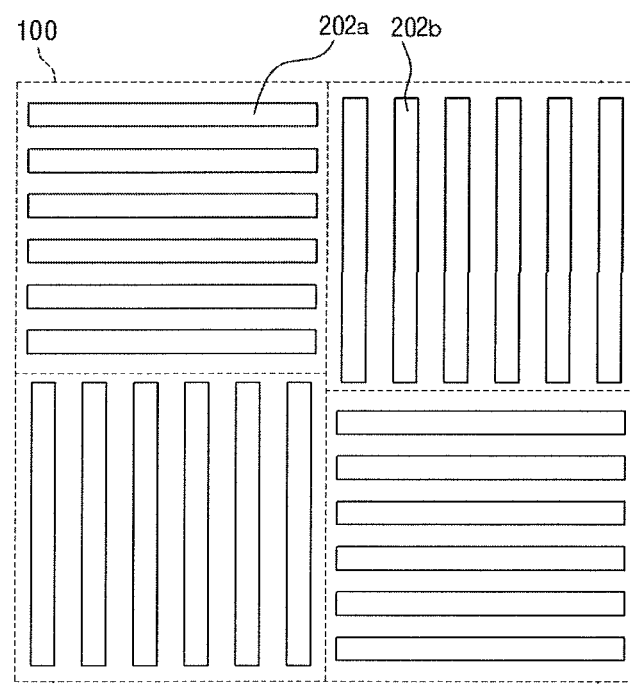
FIG. 20 illustrates a layout diagram of an overlay pattern to which a method of forming a pattern of a semiconductor device according to some embodiments is applied.

Referring to FIG. 20, the overlay pattern 100 includes a plurality of first monitoring patterns 202b extending along a first direction (X) and a plurality of second monitoring patterns 202a extending along a second direction (Y). The first and second monitoring patterns 202b and 202a can be used to align upper and lower layers during a semiconductor manufacturing process.

In the present embodiment, the overlay pattern 100 may be an area including the second area A2 that has been described with reference to FIGS. 1 to 18. In this case, the first and second monitoring patterns 202b and 202a may correspond to the second mask patterns (121b of FIG. 13). However, embodiments are not limited thereto, and the first and second monitoring patterns 202b and 202a may correspond to the second gates (220 of FIG. 18) disposed in the second trenches (T2 of FIG. 17).

Figure 21:
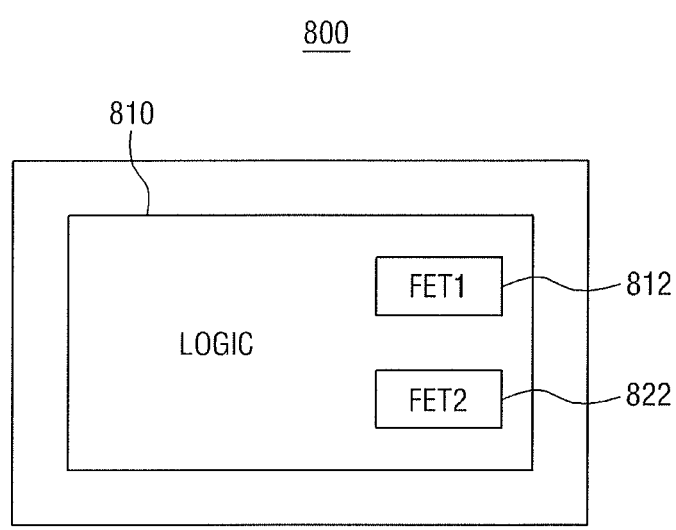
FIG. 21 illustrates a block diagram of a semiconductor device using a method of forming a pattern of a semiconductor device according to some embodiments.

FIG. 21 is a block diagram showing a semiconductor device using the method of forming a pattern of a semiconductor device according to some embodiments.

FIG. 21 illustratively shows a logic area 810 and SRAM forming areas 812 and 822, but embodiments are not limited thereto. For example, embodiments can also be applied to the logic area 810 and areas in which other memories are formed, e.g., dynamic random-access memory (DRAM), magneto-resistive random access memory (MRAM), resistive random access memory (RRAM), and phase-change random access memory (PRAM).

Figure 22:
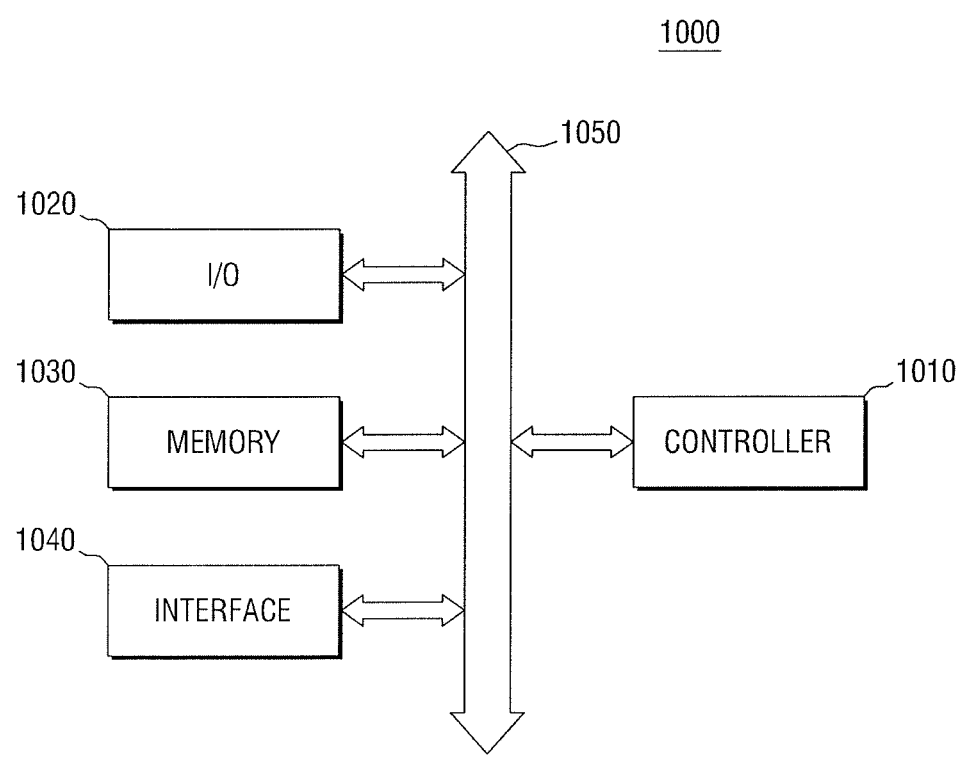
FIG. 22 illustrates a block diagram of an electronic system including a semiconductor device using the method of forming a pattern of a semiconductor device according to some embodiments.

FIG. 22 is a block diagram of an electronic system including the semiconductor device using the method of forming a pattern of a semiconductor device according to some embodiments.

Referring to FIG. 22, the electronic system 1000 according to an embodiment may include a controller 1010, an input/output (I/O) device 1020, a memory device 1030, an interface 1040, and a bus 1050. Here, the controller 1010, the input/output (I/O) device 1020, the memory device 1030, and/or the interface 1040 may be connected with each other through the bus 1050. The bus 1050 corresponds to a path through which data are transmitted.

The controller 1010 may include at least one of a microprocessor, a digital signal processor, a microcontroller, and logic devices capable of performing similar functions thereto. The input/output (I/O) device 1020 may include a keypad, a keyboard, a display device, and the like. The memory device 1030 may store data and/or instructions. The interface 1040 may perform a function of transmitting data to a communication network or receiving data from the communication network. The interface 1040 may be a wired or wireless interface. For example, the interface 1040 may include an antenna, a wired transceiver, a wireless transceiver, and the like.

Although not shown in the drawings, the electronic system 100 may further include high-speed DRAM and/or SRAM as an operation memory for improving the operation of the controller 1010. In this case, as such an operation memory, the semiconductor device using the aforementioned overlay measurement meter or method according to the embodiments may be employed. This semiconductor device may be provided in the memory device 1030, or may be provided as a part of the controller 1010 or the input/output (I/O) device 1020.

The electronic system 1000 can be applied to all electronic products capable of transmitting and/or receiving information under wireless environments, such as personal digital assistants (PDA), portable computers, web tablets, wireless phones, mobile phones, digital music players, and memory cards.

Figure 23:
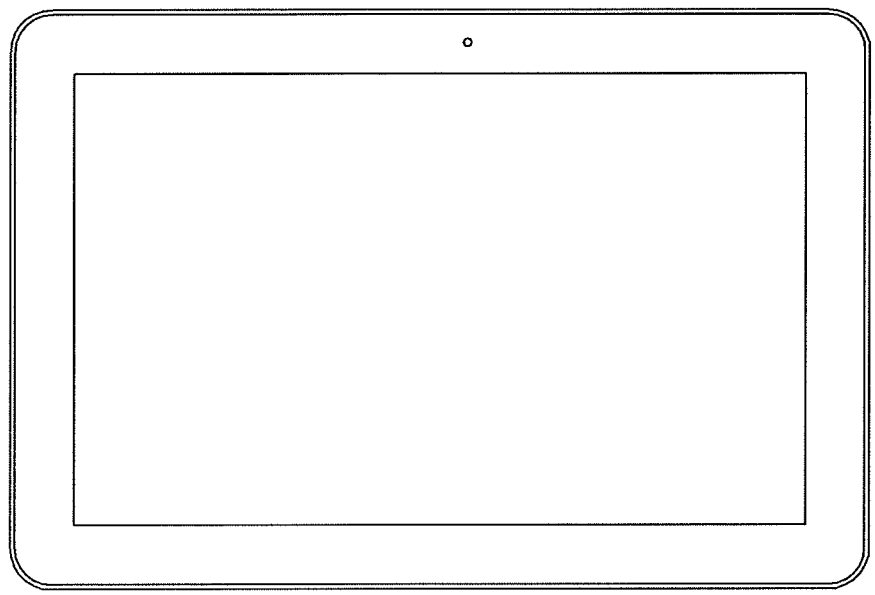
FIG. 23 illustrates exemplary semiconductor systems to which the semiconductor device using the method of forming a pattern of a semiconductor device according to some embodiments can be applied.

FIG. 23 shows exemplary semiconductor systems to which the semiconductor device using the method of forming a pattern of a semiconductor device according to some embodiments can be applied.

FIG. 23 shows a tablet PC 110. The semiconductor device using the method of forming a pattern of a semiconductor device according to some embodiments may be used for such a tablet PC 1100, a notebook computer, a smart phone, or the like.

Further, the semiconductor device according to some embodiments may also be applied to other integrated circuit devices that are not exemplified. That is, heretofore, only the tablet PC 1100 has been exemplified as an example of the semiconductor system according to the present embodiment, but examples are not limited thereto. In some embodiments, examples of the semiconductor system may include UMPCs (Ultra Mobile PCs), work stations, net-books, PDA (Personal Digital Assistants), portable computers, wireless phones, mobile phones, e-boos, PMPs (portable multimedia players), portable game machines, navigators, black boxes, digital cameras, 3-dimensional televisions, digital audio recorders, digital audio players, digital picture recorders, digital picture players, digital video recorders, and digital video players.

By way of summation and review, in a highly-integrated semiconductor device, fins having different widths from each other or trenches having different widths from each other are formed using patterns having various widths, so as to form gates having different width from each other in the trenches. Accordingly, in present embodiments, patterns having different widths from each other can be formed in different areas using a single spacer film having uniform thickness, with spacers disposed in a same area having uniform widths. Therefore, a method of forming a pattern of a semiconductor device, which can form patterns having various widths through a stable and simple process is provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming a pattern of a semiconductor device, the method comprising:
    sequentially forming a mask layer and a sacrificial layer on a substrate that includes a first area and a second area;
    etching the sacrificial layer in the first area of the substrate to form a plurality of first sacrificial pattern units, each first sacrificial pattern unit having a first width and being spaced apart from an adjacent first sacrificial pattern unit by a first distance, the first width and the first distance being different from each other;
    etching the sacrificial layer in the second area of the substrate to form a plurality of second sacrificial pattern units, each second sacrificial pattern unit having a second width equal to the first distance and being spaced apart from an adjacent second sacrificial pattern unit by a second distance equal to the first width;
    forming a spacer film conformally covering the plurality of first sacrificial pattern units and the plurality of second sacrificial pattern units, the spacer film having a first thickness and being merged between the plurality of second sacrificial pattern units;
    removing a portion of the spacer film covering upper surfaces of the plurality of first sacrificial pattern units and of the plurality of second sacrificial pattern units to expose the upper surfaces of the plurality of first sacrificial pattern units and the plurality of second sacrificial pattern units;
    removing the plurality of first and second sacrificial pattern units; and
    etching the mask layer in a region in which the plurality of first sacrificial pattern units and the plurality of second sacrificial pattern units are removed, so as to form a mask pattern.

2. The method as claimed in claim 1, wherein the first width is smaller than the second width, and the first distance is larger than the second distance.

3. The method as claimed in claim 2, wherein the first distance is more than two times the first thickness, and the second distance is two or less times the first thickness.

4. The method as claimed in claim 1, further comprising:
    forming a photoresist layer on the sacrificial layer;
    exposing and developing the photoresist layer in the first area using a first photo mask to form a plurality of first photoresist pattern units; and
    exposing and developing the photoresist layer in the second area using a second photo mask to form a plurality of second photoresist pattern units,
    wherein the first photo mask and the second photo mask are phase-inverted to each other.

5. The method as claimed in claim 1, further comprising removing the spacer film not disposed between the plurality of second sacrificial pattern units, after forming the spacer film.

6. The method as claimed in claim 1, wherein exposing the upper surfaces of the plurality of first and second sacrificial pattern units includes:
    forming a first spacer in the first area; and
    forming a second spacer in the second area, the width of the second spacer being two times the width of the first spacer.

7. The method as claimed in claim 6, wherein forming the mask pattern includes etching the mask layer using the first spacer and the second spacer as a mask.

8. The method as claimed in claim 7, further comprising:
    forming an interlayer insulating film covering the mask pattern; and
    removing the mask pattern to form a trench.

9. The method as claimed in claim 1, wherein the first area is a cell area, and the second area is a scribe lane area.

10. The method as claimed in claim 9, further comprising forming an overlay key using the mask pattern in the second area, after forming the mask pattern.

11. A method of forming a pattern of a semiconductor device, the method comprising:
    sequentially forming a mask layer, a sacrificial layer, and a photoresist layer on a substrate that includes a first area and a second area;
    exposing and developing the photoresist layer in the first area of the substrate using a first photo mask to form a plurality of first photoresist pattern units; and
    exposing and developing the photoresist layer in the second area of the substrate using a second photo mask to form a plurality of second photoresist pattern units;
    etching the sacrificial layer using the plurality of first photoresist pattern units and the plurality of second photoresist pattern units to respectively form a plurality of first sacrificial pattern units and a plurality of second sacrificial pattern units in the first area and the second area;
    forming a spacer film conformally covering the plurality of first sacrificial pattern units and the plurality of second sacrificial pattern units, the spacer film having a first thickness and being merged between the plurality of second sacrificial pattern units;
    removing the spacer film covering upper surfaces of the plurality of first sacrificial pattern units and upper surfaces of the plurality of second sacrificial pattern units to expose the upper surfaces of the plurality of first sacrificial pattern units and the upper surfaces of the plurality of second sacrificial pattern units;
    removing the plurality of first and second sacrificial pattern units; and
    etching the mask layer disposed in a region in which the plurality of first sacrificial pattern units and the plurality of second sacrificial pattern units are removed, so as to form a mask pattern,
    wherein each of the plurality of first photoresist pattern units has a first width and the plurality of first photoresist pattern units are spaced apart from each other by a first distance, the first width and the first distance being different from each other, and each of the plurality of second photoresist pattern units has a second width and the plurality of second photoresist pattern units are spaced apart from each other by a second distance, and wherein the first width is smaller than the second width, and the first distance is larger than the second distance.

12. The method as claimed in claim 11, wherein the first distance is more than two times the first thickness, and the second distance is two or less times the first thickness.

13. The method as claimed in claim 11, further comprising removing the spacer film not disposed between the plurality of second sacrificial pattern units, after forming the spacer film.

14. The method as claimed in claim 11, wherein exposing the upper surfaces of the plurality of first sacrificial pattern units and the upper surfaces of the plurality of second sacrificial pattern units includes:
   forming a first spacer in the first area; and
   forming a second spacer in the second area, the width of the second spacer being two times the width of the first spacer.

15. The method as claimed in claim 14, wherein forming the mask pattern includes etching the mask layer using the first spacer and the second spacer as a mask.

16. A method of forming a pattern of a semiconductor device, the method comprising:
   sequentially forming a mask layer and a sacrificial layer on a substrate;
   etching the sacrificial layer in a first area of the substrate to form a plurality of first sacrificial pattern units, each first sacrificial pattern unit having a first width and being spaced apart from an adjacent first sacrificial pattern unit by a first distance, the first width and the first distance being different from each other;
   etching the sacrificial layer in a second area of the substrate to form a plurality of second sacrificial pattern units, each second sacrificial pattern unit having a second width equal to the first distance and being spaced apart from an adjacent second sacrificial pattern unit by a second distance equal to the first width, the pluralities of first and second sacrificial pattern units being formed via phase-inverted photomasks, respectively;
   conformally forming a spacer film on the plurality of first and second sacrificial pattern units, such that the spacer film defines a trench between adjacent first sacrificial pattern units, and fills a space between adjacent second sacrificial pattern units;
   removing a first portion of the spacer film covering upper surfaces of the plurality of first and second sacrificial pattern units;
   removing the plurality of first and second sacrificial pattern units; and
   etching the mask layer through a second portion of the spacer film to form a mask pattern.

17. The method as claimed in claim 16, wherein conformally forming the spacer film includes forming a single spacer film with a uniform thickness in both the first and second areas of the substrate.

18. The method as claimed in claim 17, wherein conformally forming the spacer film includes continuously forming the single spacer film in the first and second areas of the substrate.

19. The method as claimed in claim 17, wherein conformally forming the spacer film includes adjusting the thickness of the spacer film to completely fill the space between adjacent second sacrificial pattern units, while defining the trench between adjacent first sacrificial pattern units.

20. The method as claimed in claim 16, wherein removing the first portion of the spacer film and the plurality of first and second sacrificial pattern units includes maintaining the second portion of the spacer film on the substrate, the second portion of the spacer film having first patterns of a third width in the first area of the substrate and second patterns of a fourth width different from the third width in the second area of the substrate.

* * * * *